United States Patent
Taniguchi

[19]

[11] Patent Number: 5,945,239
[45] Date of Patent: Aug. 31, 1999

[54] ADJUSTMENT METHOD FOR AN OPTICAL PROJECTION SYSTEM TO CHANGE IMAGE DISTORTION

[75] Inventor: Tetsuo Taniguchi, Yokohama, Japan

[73] Assignee: Nikon Corporation, Tokyo, Japan

[21] Appl. No.: 08/811,465

[22] Filed: Mar. 3, 1997

[30] Foreign Application Priority Data

Mar. 1, 1996 [JP] Japan .................................. 8-044373

[51] Int. Cl.$^6$ ........................................................ G03F 9/00
[52] U.S. Cl. ................................................................ 430/30
[58] Field of Search ................................................ 430/30

[56] References Cited

U.S. PATENT DOCUMENTS

| | | | |
|---|---|---|---|
| 4,908,656 | 3/1990 | Suwa et al. | 355/53 |
| 5,656,403 | 8/1997 | Shieh | 430/30 |
| 5,677,091 | 10/1997 | Barr et al. | 430/30 |
| 5,693,439 | 12/1997 | Tanaka et al. | 430/30 |

FOREIGN PATENT DOCUMENTS 8-22951  1/1996  Japan .

*Primary Examiner*—Christopher G. Young
*Attorney, Agent, or Firm*—Klarquist Sparkman Campbell Leigh & Whinston, LLP

[57] ABSTRACT

Methods and apparatus are disclosed for correcting distortion of a projection image obtained with a projection-exposure apparatus (such as a stepper) having a projection-optical system. Distortion is corrected even when the distortion of the projection image is not linear relative to depth in the optical-axis direction of the projection-optical system. Any distortion of the projection image is detected at a measurement surface and while the projection image is defocused in a direction along the optical axis relative to an image surface of the projection-optical system. Based on the detection results, the projection-optical system is adjusted to change the distortion relative to the converging surface of the projection-optical system.

27 Claims, 3 Drawing Sheets

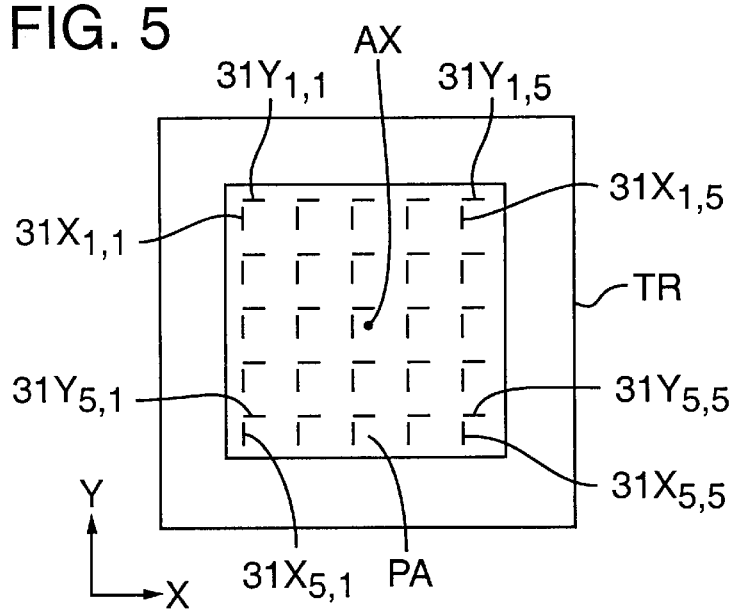
FIG. 5
FIG. 6(a)
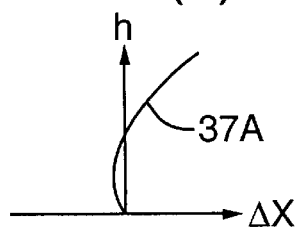
FIG. 6(d)
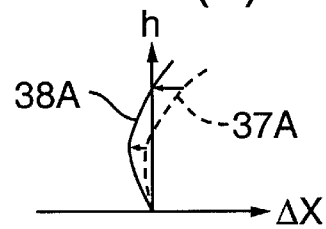
FIG. 6(b)
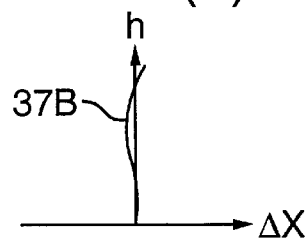
FIG. 6(e)
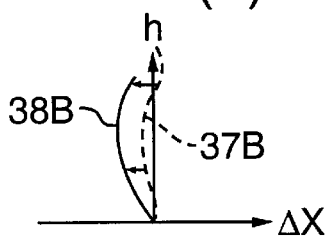
FIG. 6(c)
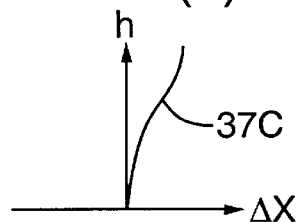
FIG. 6(f)
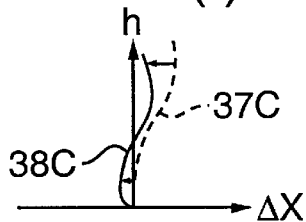

ADJUSTMENT METHOD FOR AN OPTICAL PROJECTION SYSTEM TO CHANGE IMAGE DISTORTION

FIELD OF THE INVENTION

The present invention pertains to optical projection photolithography systems, especially such systems as used for manufacturing semiconductor devices, liquid crystal display elements, charge-coupled devices, thin-film magnetic heads, and other elements and the like. Such projection systems are used to expose a pattern, defined on a mask or reticle, on a photosensitive substrate using light refracted by the optical projection system.

BACKGROUND OF THE INVENTION

Projection exposure apparatus such as steppers are known in the art. Such apparatus are operable to perform photolithography processes in which a pattern defined on a reticle (i.e., a mask) is transferred onto a semiconductor wafer, glass plate, or other photosensitive substrate. Light used to make the exposure is projected onto the substrate using an optical projection system. Usually, manufacture of semiconductor devices, displays, and the like requires a large number of fabrication steps including separate exposures of different patterns at the same locations on the substrate. Thus, each subsequent exposure made at a location on the substrate requires very accurate alignment and superposition of the present pattern with patterns that were formed on the substrate during previous process steps. Virtually any shifting or distortion of any portion of the actual projected image relative to the intended image cannot be tolerated. This requires extraordinary control of any variable distortion of the projected image.

During the manufacture of a projection-exposure apparatus, it is sometimes necessary to accurately measure the distortion of a projection image formed by the optical projection system and, based on the measurement results, to make an adjustment in the projected-image distortion. Unfortunately, this does not redress the effect of variable (i.e., changes in) distortion arising after such an adjustment is made.

One conventional way in which to adjust the distortion of a projection image is to projection-expose an image of a test pattern, as defined by a "test reticle," onto a test wafer. At various locations in the test image on the test wafer, points of convergence are measured against specifications.

According to another known method of measuring projected-image distortion, locations of various points of convergence (i.e., image points) in an image of the pattern defined by a test reticle are measured directly using a photoelectric sensor movable from one image point to another. Such a method eliminates the need to expose and develop a test wafer.

After measurement of distortion of a projection image on the image surface (i.e., locus of image points at the best-focus position of the projection optical system) of an optical projection system, one conventional way in which to correct an unwanted distortion is to move the projection-optical system relative to the reticle. Alternatively, such correction can be performed by moving a portion of the projection-optical system relative to the image surface. Both methods are used during the manufacture of a projection exposure apparatus.

Projection-image distortion can change due to environmental changes as manifested by dimensional fluctuations of the projection-exposure apparatus. Experience has also revealed that variations in projection-image distortion can be caused by corresponding changes in components such as the reticle. Two methods are known for correcting such problems. In one method, projection-image distortion is either measured or determined as required by calculations performed under various exposure conditions, and then the distortion is corrected for such conditions according to the results of such measurements or calculations. In the other method the projection-image distortion is measured, at fixed intervals of time or whenever exposure conditions are known to have changed, by a photoelectric sensor and then corrected based on the measurement results.

Normally, a projection-optical system is designed so that at least the wafer side of the system is telecentric. In such a system, the illumination light on the wafer side of the projection-optical system is parallel to the optical axis of the system. Thus, the projection magnification does not change upon any displacement of the wafer in the optical-axis direction.

Whenever the telecentricity of the projection-optical system is not constant, telecentricity should be measured along with distortion, and the telecentricity adjusted as required to within specifications.

An example of a method for measuring telecentricity involves measuring the magnification of the projection-optical system at various locations on the optical axis. Telecentricity is calculated from the amount by which magnification changes with a change in measurement location. Based on the calculation results, an optical element or group of elements of the illumination system, for example, can be adjusted to change the telecentricity.

Adjustments for projection-image distortion and for telecentricity can be conducted independently. Usually, the position of the image surface of the projection-optical system is determined first. Then, any distortion is measured at various points on a projected image where the focal point is at the best-focus position. Adjustments are normally made so that the projection-image distortion at the best-focus position is at the lowest achievable level. Likewise, with respect to telecentricity (and without taking into account any projection-image distortion), adjustments are made so that any variance from the ideal constancy of magnification in the optical axis direction is within specifications.

If a variation arising in the imaging position (at a location on a plane substantially perpendicular to the optical axis) of the projected image relative to the best-focus position is the cause of a slope of the main optical axis, then the imaging position of the projection image relative to the shifting from the best-focus position varies linearly. Hence, if the projection-image distortion measured at the best-focus position is adjusted, then the projection-image distortion will effectively be adjusted optimally even if the exposure is made at a location that is displaced from the best-focus position due to an incorrect exposure operation or other process step.

In view of the ever decreasing size of pattern widths which are the exposure target in recent years, the imaging position of the pattern is not only influenced by a slope in the main light beam but also aberrations (frame aberrations and spherical aberrations) of the optical projection system and does not vary linearly with respect to position shifts from the best focus position.

For example, when the wafer shifts from the best focus position in the optical axis direction while the pattern is being exposed onto the wafer, the imaging position will also shift in the same direction regardless of whether the wafer shifts in either the upper or lower direction of the optical axis. Therefore, when the shifting of the focal point position during an actual process exposure is considered as above, a conventional correction method for projection image distortion cannot be said to be a suitable adjustment method for projection image distortion. In other words, there is a defect where the exposure is carried out at a position away from the best focus position, for instance, a position close to the edge of the gradient photo-resist layer on the wafer and not the symmetry centered on the best focus position consequently resulting in the generation of projection image distortion.

Further changes in the illumination conditions to the reticle are made due to the above-mentioned super high resolution technology seen in recent years. At the time these changes are made, the light path of the light beam within the optical projection system varies greatly depending on those illumination conditions. Because of this, optimizing aberrations of the optical projection system and the telecentricity under all conditions is difficult. In addition, the amount of variation of the imaging position when the wafer shifts in the optical axis direction and the shifting from the linearity of that amount of variation increases depending on the illumination conditions resulting in the image distortion of the projection image expanding even more.

Moreover, as stated above, in recent years measurements of projection image distortion have been carried out by using a photoelectric sensor to detect a spatial image of a pattern on a reticle.

When actually exposing a pattern of a reticle onto a test wafer and directly measuring the distortion of the pattern image formed on the test wafer, because there is a thickness to the resist on the wafer, the projection image distortion averaged to a certain degree in the optical axis direction is measured. However, there is a defect wherein when the measurement is carried out by a photoelectric sensor, the measurement is made on one certain plane thereby making it impossible to accurately discover variations of only the projection image distortion in the optical axis direction.

In addition, one approach in recent years for increasing the depth of focus involves a method in which an exposure is made while shifting the substrate to be exposed (wafer) in the optical axis direction. In this system, there is a defect wherein the distortion of the projection image is not sufficiently corrected by only adjusting for the distortion of the projection image at the best focus position because the exposure is carried out in a defocus state.

SUMMARY OF THE INVENTION

In view of these points, the object of the present invention is to provide a method that allows the distortion of the projection image to be optimally corrected.

In particular, the object of the present invention is to provide a method by which the distortion of the projection image can be optimally corrected even when the distortion of the projection image is not linear relative to depth in the optical-axis direction of the projection-optical system.

A further object of the present invention is to provide a projection-exposure apparatus operable to perform such distortion correction.

According to a preferred embodiment, a method for reducing (or otherwise changing) distortion of a projection image produced by a projection-optical system comprises detecting, at a measurement surface, any distortion of the projection image imparted by the projection optical system. The projection image is defocused in a direction along the optical axis relative to an image surface of the projection-optical system. Based on the results obtained from the detecting of distortion, the projection-optical system is adjusted to change the distortion imparted by the projection-optical system, relative to the converging surface of the projection-optical system. For example, after defocusing the light-sensitive substrate in the optical-axis direction, the projection-optical system can be adjusted based on the projection image in the actual defocused state. Thus, image distortion can be optimally corrected even when the change in projection-image distortion imparted by the projection-optical system is not linear in the optical-axis direction.

The projection-image distortion imparted by the projection-optical system is preferably measured at multiple positions in the optical-axis direction. Based on the measurement result, the projection-optical system is adjusted. Measurements are preferably made by changing the position, in the optical-axis direction, of the projection-optical system and measuring the projection-image distortion imparted by the projection-system. Thus, it is possible to determine the rate by which the projection-image distortion changes in the optical-axis direction, including changes due to deviations from telecentricity of the projection optical system.

Preferably, the converging characteristics of the projection-optical system are adjusted such that the rate of change of image distortion is set to a minimum within the depth of focus of the projection optical system. Setting the rate of change to a minimum can mean setting a maximum value, or an average value or a median value of the projection image distortion of each image height to a minimum at a plurality of positions of the optical axis direction (AX) at equal intervals within the depth of focus. By means of this action, projection-image distortion within the depth of focus of the projection-optical system can be optimally adjusted.

A projection-exposure apparatus according to the present invention is preferably operable to project a pattern image, defined on a mask, onto a substrate through a projection-optical system under illumination light used for exposure. The projection-exposure apparatus comprises one or more detectors operable to measure distortion, in the optical-axis direction, of the projection image. The apparatus also comprises an arithmetic processor that, based on a detection result obtained by the detector, determines the projection-image distortion imparted by the projection-optical system at multiple positions in the optical-axis direction. The apparatus also comprises an adjustment system that, based on the projection-image distortion calculated by the arithmetic processor, adjusts at least a portion of the projection-optical system. The projection-optical system is preferably adjusted such that the distribution of distortion of the projection image is set to a minimum.

The foregoing and additional features and advantages of the present invention will be more readily apparent from the following detailed description, which proceeds with reference to the accompanying drawings.

BRIEF DESCRIPTION OF THE DRAWINGS

FIG. 5 is a top plan view showing a representative arrangement of measurement marks, as used for measurements according to the present invention, on the test reticle TR of FIG. 1.

FIGS. 6(a)–6(f) are plots showing the effect of correcting distortion using a method according to the present invention.

DETAILED DESCRIPTION

With respect to a preferred embodiment of an apparatus according to the invention, a stepper-type projection-exposure apparatus is provided that performs an exposure, through a projection-optical system, of a pattern defined by a reticle at each shot region on a wafer. The projection-exposure apparatus is operable to permit adjustment of the distortion imparted by the projection-optical system to an image of the reticle pattern on the wafer.

Figure 1:
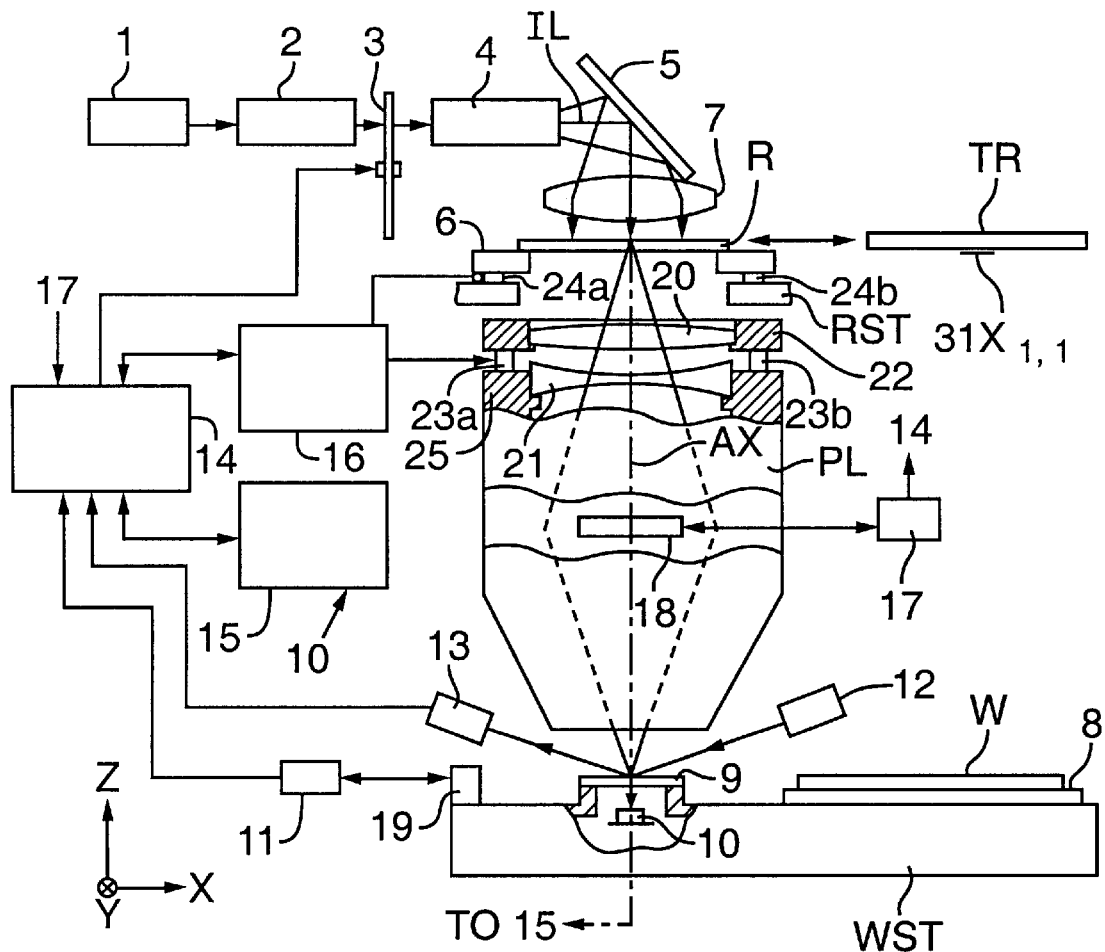
FIG. 1 is a schematic elevational diagram of a projection-exposure apparatus according to a preferred embodiment of the present invention.

FIG. 1 is a partially cut-away view showing certain features of the embodiment. An illumination light IL is emitted from a light source 1 and passes through a uniformizer 2 such as a fly-eye lens that serves to make uniform the intensity of the illumination light IL on the reticle R.

The light source 1 can be, for example, an i-line or g-line ultra-high pressure mercury lamp, an excimer laser (e.g., KrF or ArF), a harmonic-wave copper vapor laser, a YAG laser, or other suitable light source.

After passing through the uniformizer 2 the illumination light IL encounters a selectable diaphragm 3. The selectable diaphragm 3 can comprise, for example, an annular-illumination diaphragm and an oblique-illumination diaphragm, either of which can be selectably placed in the light path ed for optimal resolution. The diaphragm selection is controlled by a main controller 14 (e.g., an arithmetical processor).

The selectable diaphragm 3 can also be used to adjust the numerical aperture NA of the illumination system, and to change the illumination condition for the reticle R.

After passing through the selectable diaphragm 3, the illumination light IL passes through a relay optical system 4 that preferably comprises a field stop and a relay lens. The illumination light is reflected downward by a dichroic mirror 5. The illumination light IL then passes through a condenser lens 7 to uniformly illuminate the reticle R.

Light passing through the reticle R passes through a projection-optical system PL to form an image of the reticle pattern on a "shot region" of a wafer W. The wafer W is coated with a photoresist by which the image of the reticle can be "transferred" onto the surface of the wafer. In FIG. 1, the wafer W has been moved laterally away from the projection-optical system PL for ease of discussion of other features.

At the pupil plane of the projection-optical system PL a pupil filter 18 is placed. The pupil filter 18 is constructed so as to be freely removable and insertable via a pupil-filter driver 17 connected to and controllably operated by the main controller 14. The pupil filter 18 increases resolution by shielding one portion of a light beam passing through the pupil plane. The pupil filter 18 is positioned on the pupil plane via the pupil-filter driver 17 as necessary, depending upon the condition of the exposure pattern formed on the reticle R.

In the description below, the X-axis is regarded as extending parallel to the plane of the page of FIG. 1, and the Y-axis is regarded as extending perpendicular to the plane of the page of FIG. 1. The Z-axis extends perpendicular to the X and Y axes, and the optical axis AX of the projection optical system PL extends parallel to the Z axis.

During exposure, the reticle R is held by, e.g., vacuum suction to a reticle holder 6. The reticle holder 6 is mounted on a reticle stage RST that is freely movable in a two-dimensional plane (XY plane) via drivers 24a, 24b each preferably comprising a piezoelectric element. The reticle stage RST is very precisely movable in the XY plane perpendicular to the optical axis AX of the projection optical system PL to effect two-dimensional positioning of the reticle R. The reticle holder 6 can also be moved parallel to the optical axis AX via the drivers 24a, 24b and can be tilted relative to the plane perpendicular to the optical axis AX.

The position of the reticle stage RST is precisely measured by an interferometer (not shown in FIG. 1). The interferometer obtains information used to obtain measurement data used to control the position of the reticle stage RST.

The wafer W is held by a wafer holder 8 on a wafer stage WST preferably by vacuum suction. A reference plate 9 defining various reference patterns is fixed to the wafer stage WST close to the wafer holder 8. Beneath the bottom surface of the reference plate 9 is a photodetector 10 comprising, for example, a photodiode or a photomultiplier. The wafer stage WST is operable to move the wafer W and the reference plate 9 within the XY plane (X and Y directions) perpendicular to the optical axis AX. To expose the wafer, the wafer stage WST is normally moved in a step-and-repeat manner or step-and-scan manner.

The wafer stage WST can also very precisely move the wafer W in the Z direction to effect, inter alia, auto-focus control by which the image surface of the projection-optical system PL is made coincident with the wafer surface. The wafer stage WST is also operable to tilt the wafer surface relative to a plane perpendicular to the optical axis AX.

A movable mirror 19 is affixed to an edge of the wafer stage WST. The position of the wafer stage WST in the XY plane is measured at a resolution of, for example, 10 nm or less by an interferometer 11 interacting with the movable mirror 19. Positional measurement data obtained by the interferometer 11 are supplied to the main controller 14. Based on the measurement data, the main controller 14 positions the wafer stage WST two-dimensionally.

Arranged above the wafer stage WST and aside the lower portion of the projection-optical system PL is an oblique-incidence type focal-point position-detection system (termed herein a "focal-point position system"). The focal-point position system comprises a light transmitter 12 and a light receiver 13 that detect the position of the wafer W in the Z-direction at a resolution of 100 nm or less. The light transmitter 12 produces a light beam having a wavelength to which the photo-resist on the wafer W is not sensitive. The light beam from the light transmitter 12 is irradiated onto the surface of the wafer W and reflected. The reflected light is received by the light receiver 13. Displacement of the wafer W in the Z-direction is detected as a shift in position of a point at which the reflected light converges. A focus signal corresponding to the amount of Z-axis movement experienced by the wafer W is supplied to the main controller 14. Based on the focus signal, the main controller 14 can direct movement of the wafer stage WST in the Z-direction until the surface of the wafer W is in the best-focus position.

The focal-point position system 12, 13 is arranged to allow measurements at multiple points on the wafer surface within the exposure region of the projection optical system. Measurement values obtained at the multiple points within the exposure region permit determination of the inclination of the wafer W relative to an XY plane. Based on such inclination measurements, the main controller 14 can direct movement (auto leveling) of the wafer stage WST so as to match the surface of the wafer W to the optimum image surface of the projection optical system PL.

Normally, calibration of the focus signal is carried out such that the optimum image surface is a zero-point reference. Auto-focus and auto-leveling are normally carried out until each focus signal from the light receiver 13 reaches a value denoting "zero."

The projection-exposure apparatus of this embodiment also comprises a detection system for measuring any projection-image distortion formed by the projection-optical system. In FIG. 1, the distortion-detection system is disposed at the center of the exposure field of the projection-optical system PL.

Further with respect to the distortion-detection system, the reference plate 9 on the wafer stage WST is moved within the exposure field of the projection-optical system PL to perform distortion measurements. The reference plate 9 is arranged at about the same height as the wafer W. During distortion measurement of the projection image formed by the projection-optical system PL, the reticle R can be replaced with a test reticle TR and the illumination light IL irradiated onto the test reticle TR.

Measurement marks (In FIG. 1, one measurement mark $31X_{1,1}$ for measurements in the X-direction is shown) are provided on the test reticle TR at a plurality of locations within the pattern region. Measurements made using the measurement marks are normally made before an actual exposure using the reticle R. Illumination light IL passing through the measurement mark $31X_{1,1}$ on the test reticle TR passes through the projection-optical system PL and converges at the wafer side.

Figure 2A:
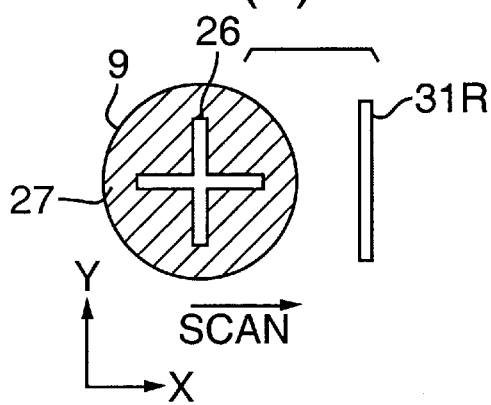
FIG. 2(a) is a top plan view of the reference plate 9 of FIG. 1 and of a corresponding measurement mark.

FIG. 2(a) shows a projected image 31R of the measurement mark $31X_{1,1}$ formed by the projection-optical system PL (referred to as a "spatial image"). The reference plate 9 includes a very small cross-shaped slit 26 that functions as a detector of measurement marks. The cross-shaped slit 26 is formed at approximately the center of the reference plate 9 and a light-blocking region 27 (e.g., a metal film) extends around the periphery of the slit 26. The reference plate 9 is manufactured from, for example, quartz glass and the slit 26 represents an opening in the metal film.

As the wafer stage WST scans in the X-direction as indicated by the arrow in FIG. 2(a), the slit 26 of the reference plate 9 traverses over the spatial image 31R of the measurement mark $31X_{1,1}$. At the instant of traversal, converging light making up the spatial image 31R passes through the slit 26 so as to be incident on the photoelectric detector 10.

The electrical signal output from the photoelectric detector 10 varies in relation to the position of the wafer stage WST. The electrical signal is directed to an image-distortion measurement system 15 which directs a corresponding signal to the main controller 14.

Based on the electrical signal supplied from the image-distortion measurement system 15, the main controller 14 calculates the projection-image distortion imparted by the projection optical system PL. Based on the calculation result, the main controller 14 adjusts the image characteristics of the image formed by the projection-optical system PL with an image-distortion correction system 16. When measuring the image distortion imparted by the projection-optical system PL, a command to measure the image distortion is issued from the main controller 14 to the image-distortion measurement system 15.

Figure 2B:
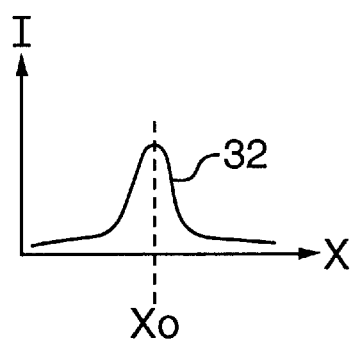
FIG. 2(b) is a plot of intensity versus displacement obtained when the measurement mark is moved relative to the reference plate.

FIG. 2(b) shows the results of the output of the photoelectric detector 10. The abscissa is the position x in the scanning direction of the wafer stage WST and the ordinate is the signal output level I of the photoelectric detector 10. In FIG. 2(b), the imaging position of the measurement mark $31X_{1,1}$ of the test reticle TR can be measured by finding a position $X_0$ where the output value I is greatest. The same type of measurement is carried out for the remaining measurement marks on the test reticle TR, and the relevant data is stored in a memory of the main controller 14. Thus, the positional relationship of all the measurement marks on the test reticle TR are known in advance. The magnification error and the distortion of the image projected by the projection-optical system PL can be detected from the displacement amount of these projected measurement marks relative to the target (ideal) projected positions.

An identical measurement of the multiple measurement marks is carried out at each of plural positions in the Z-direction. I.e., the wafer stage WST is moved by a predetermined amount in the Z-direction; at each of the Z-direction positions, the imaging position of each measurement mark is measured. (The Z-direction position of the reference plate 9 is measured by the focal-point position system 12, 13.) Thus, data on projection-image distortion at various positions shifted in the Z-direction relative to the best-focus position, are obtained. I.e., data on the distortion of the projected image in a defocused state are obtained.

Although the example of FIG. 2 shows an example of a measurement in the X-direction, measurements in the Y-direction can be obtained in a similar manner. Furthermore, if measurement marks are formed around the periphery of an actual process reticle R, measurements of the projection-image distortion can be obtained without having to use a test reticle TR. Thus, projection-image distortion can be measured at any time using the actual process reticle R for initial distortion adjustments or for distortion adjustments made at any other time, especially whenever the projection-image distortion is likely to vary such as during atmospheric pressure variations or changes in the illumination condition.

When detecting a projected image of the measurement mark, it is not necessary to use a photoelectric detector as described above. It is alternatively possible, e.g., to actually expose the measurement mark(s) of the test reticle TR onto a test wafer and measure the resulting image formed on the test wafer.

By measuring the imaging position of each measurement mark at each of the multiple positions in the Z direction as described above, the projection-image distortion at positions shifted in the Z-direction from the best-focus position can be measured.

Methods utilizing a photoelectric detector are not limited to the scheme shown in FIGS. 2(a)–2(b). One can also use methods that, for example, enlarge the spatial image 31R of the measurement mark $31X_{1,1}$ and measure the position of the mark by, e.g., a line sensor.

Next, an apparatus for correcting projection-image distortion will be described.

As described previously, the drivers 24a, 24b are situated between the reticle holder 6 and the reticle stage RST. These drivers 24a, 24b are operable to move the reticle holder 6 parallel to the optical axis AX. The drivers 24a, 24b can also differentially move so as to cause the reticle holder 6 to be tilted relative to a plane perpendicular to the optical axis. Thus, the position of the reticle R relative to the projection-optical system PL can be changed. By so moving the reticle R relative to the projection-optical system PL, the projection-image distortion can also be varied. By actuating the drivers 24a, 24b, a particular projection-image distortion can be corrected.

Referring further to FIG. 1, the projection-optical system PL comprises a support member 22 and a lens barrel 25 that are connected together via a driver system preferably comprising at least three piezo elements that can expand and contract (FIG. 1 shows two of such piezo elements 23a, 23b). To the support member 22 is mounted a lens element 20 of the projection-optical system PL closest to the reticle R. The lens barrel 25 holds a lens group (including a lens element 21 but not lens element 20). By actuating the piezo elements 23a, 23b, (and at least a third piezo element not shown), the support member 22 (with lens 20) can be urged to move in directions parallel to the optical axis AX and independently to cause the optical axis of the lens element 20 to be slightly angled relative to the optical axis AX. (In this embodiment, the optical axis AX of the projection-optical system PL indicates the optical axis of the main body of the optical projection system PL below the lens element 21.) I.e., by appropriately actuating the piezo elements 23a, 23b, the position of the lens element 20 can be moved slightly relative to the position of the lens element 21. In such a manner, the projection-image distortion can be varied.

Moving the lens element 20 relative to the lens element 21 can allow the magnification component, the trapezoid component, and the higher-order bending component (for example, pin cushion and barrel distortion) of the projection-image distortion to be corrected.

Further with respect to FIG. 1, The piezo elements 23a, 23b of the reticle R and the piezo elements 24a, 24b of the projection optical system PL are driven by the image-distortion correction system 16.

The relationship between the amount of displacement imparted by actuating the piezo elements 23a, 23b, 24a, 24b and the resulting corresponding amount of projected-image distortion can be determined by experiments done beforehand and/or by calculations. Data from such experiments and/or calculations are preferably stored in a memory of the main controller 14. Thus, the image-distortion correction system 16 can actuate the drivers 23a, 23b and 24a, 24b based on data of the required amount of distortion adjustment as determined by the main controller 14.

After determining the relationship between the driving amount of the piezo elements 23a, 23b, 24a, 24b versus amounts of resulting projection-image distortion, the maximum and minimum amounts of distortion (at a plurality of different positions in the Z-direction) remaining after making any of various distortion adjustments can be determined. Such information facilitates a calculation of specifically what correction yields the smallest residual (post-correction) distortion. This is a problem of linear optimization.

Furthermore, a confirmation can be made as to whether or not the projection-image distortion is properly corrected after the drive elements 23a, 23b, 24a, 24b have been actuated. This is done by measuring the projection-image distortion again using the photoelectric detector 10.

During initial distortion adjustments (made during manufacturing or any time thereafter) and distortion adjustments made for maintenance (i.e., made according to a schedule or as required during the life of the apparatus), the amount of expansion and contraction of each of the drive elements 23a, 23b, 24a, 24b can be independently set as required by the operator. Also, alternatively to using drive elements 23a, 23b, 24a, 24b to shift one or more optical elements of the projection-optical system along the Z direction, other schemes can be employed such as rotatable lens-element mountings or mountings supported by threaded rods or the like.

Next, a distortion-detection and correction method for projection-image distortion is described with reference to FIGS. 3(a)–3(b), 4, 5, and 6(a)–6(f).

Figure 3A:
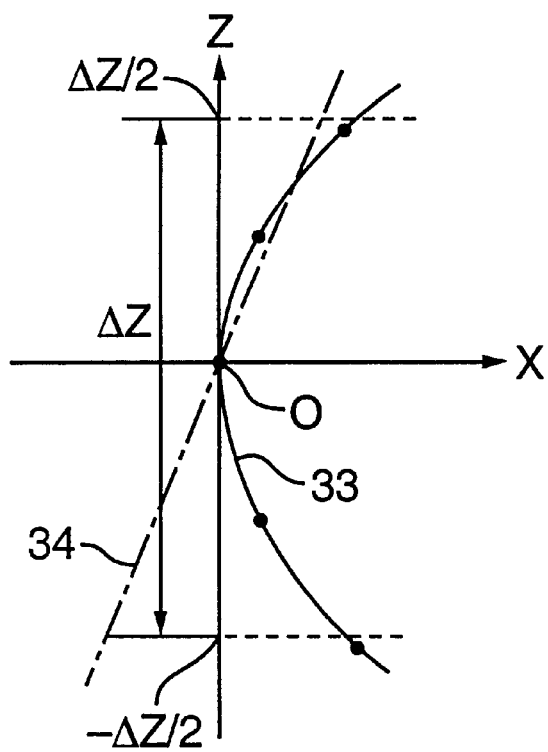
FIGS. 3(a)–3(b) are plots describing a method for correcting projection-image distortion according to a preferred embodiment of the invention.

With respect to the projection-optical system PC, FIG. 3(a) shows representative changes in imaging position in the optical axis AX direction (Z direction). The abscissa is displacement amount (x) in the X direction of the convergence point and the ordinate is position or height (z) of the convergence point in the Z direction.

Convergence-point displacement can be caused by, inter alia, the projection-optical system PL exhibiting a slight deviation from exact telecentricity on the wafer side. In FIG. 3(a), displacement resulting solely from such a cause is indicated by the straight (dashed) line 34. In such an instance, by measuring the position of a convergence point at two different heights (i.e., two different positions in the Z-direction), the telecentricity of the projection-optical system PL can be ascertained. An adjustment can be made until the point labeled "0" in the plot 34 is at the intersection of the abscissa and the ordinate. This effectively eliminates distortion at the best-focus position (taking 0 as the height z of the best-focus position), even if there is a residual deviation from telecentricity that cannot be corrected. This also effectively adjusts the image distortion of the projection image to its minimum level.

Referring further to FIG. 3(a), the amount by which the imaging position of a projected image is displaced a distance x with respect to an actual image position in the Z-direction varies according to the curve 33. The curve 33 traces the data obtained for a representative convergence point at five different elevational (Z axis) positions; one at the best-focus position (0), two positions in the +Z direction and two similarly spaced positions in the −Z direction. The curve 33 also illustrates how the imaging position can change when the projection-optical system exhibits actual aberrations rather than a simple deviation from telecentricity.

The curve 33 shows that the displacement amount x of a convergence point of a projected image within the depth of focus $\Delta Z$ is positive at both positive and negative positions in the Z-direction relative to the best-focus position. The positive shift increases with greater displacement in the Z direction from the best-focus position. Thus, even if a displacement amount x of a convergence point is adjusted to be zero at the best-focus position, the convergence point will be situated at a positive value of x at all non-zero values of z.

In FIG. 3(a), the curve 33 does not exhibit as much displacement variation as the straight line 34 i.e., sum of all values of x within a range from $+\Delta Z/2$ to $-\Delta Z/2$ is greater with the line 34 than with the curve 33). However, when illumination conditions are changed, it is possible for the displacement variation to increase from that indicated by the curve 33 in FIG. 3(a). Because superposition precision generally becomes more demanding with increases in the planar dimensions of the reticle pattern, the displacement amounts x on the curve 33 cannot be ignored. Furthermore, whenever there is a level difference in the wafer W, the influence of shifts in the imaging position cannot be ignored.

Figure 4:
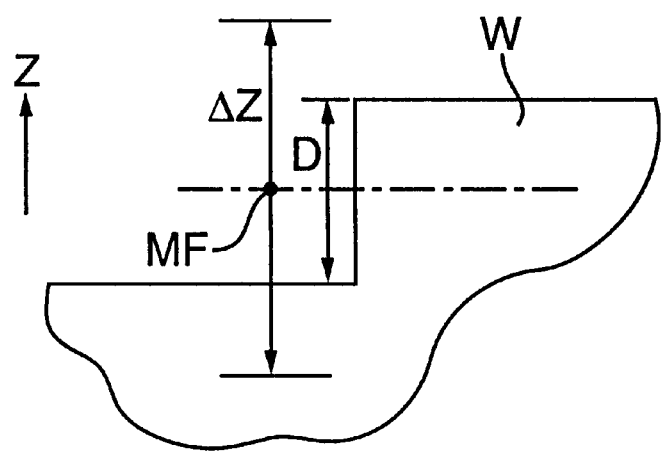
FIG. 4 is an elevational schematic diagram of the relationship between depth of focus and level difference.

FIG. 4 shows an exemplary level difference in a wafer W. This type of level difference occurs at, for example, the junction surface between the one portion of a DRAM memory and a peripheral circuit portion. In FIG. 4, D is the level difference (i.e., elevational difference), ΔZ is the depth of focus of the projection-optical system PL, and MF is the best-focus position. As can be seen, the best-focus position MF is at approximately the midpoint of the level difference D. Whenever the level difference D is about equal to the depth of focus ΔZ, exposures are made at an elevational level on or near an extreme of the displacement variation curve within the depth of focus ΔZ, resulting in a comparatively large projection-image distortion.

In contrast, in this method embodiment the imaging position is measured at a plurality of height Z points (at least three points) and corrections are made such that the variation in the displacement amount x within the depth of focus ΔZ is minimized.

Figure 3B:
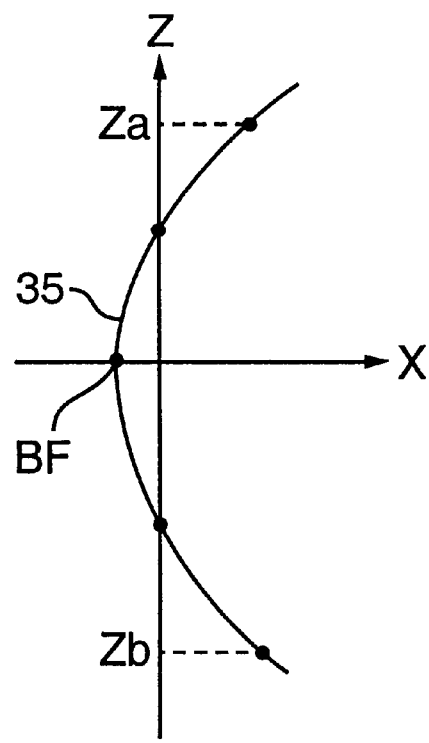

FIG. 3(b) shows a representative plot 35 of the amount by which the imaging position of a projected image is displaced a distance x with respect to an actual image position in the Z-direction after corrections have been made according to the present method embodiment. The abscissa and ordinate are as described above with respect to FIG. 3(a). In FIG. 3(b), zero is considered to be the height z of the best-focus position. The curve 35 links a total of five measured convergence points: one at the best-focus position BF, two above the best-focus position, and two similarly spaced points below the best-focus position. It will be appreciated that the curve 35 is similar to the curve 33, but the curve 35 is shifted leftwise.

Comparing FIG. 3(b) with FIG. 3(a), although the displacement amount x in FIG. 3(b) at the best-focus position BF is larger than in FIG. 3(a), the displacement amount x of the useful convergence points $Z_a$, $Z_b$ (FIG. 3(b)) is smaller than (about half) the displacement amount of corresponding points on the curve 33 in FIG. 3(a). (The convergence points $Z_a$, $Z_b$ are close to respective edges of the depth of focus ΔZ and are thus of practical value.)

FIGS. 3(a) and 3(b) illustrate the correction of projection-image distortion at one point within the exposure region. However, as described above, projection-image distortion can also be optimally corrected within the entire exposure region. To such end, multiple measurement marks are formed on the surface of the test reticle TR. Using such measurement marks, calculations can be made that apply to all the measurement points within the exposure region.

First, at each measurement mark, the image distortion (i.e., displacement amount x) is measured over a range in the Z direction (along the optical axis AX). The preferred measurement range in the Z direction is within the practical depth of focus ΔZ and is determined by, e.g., the linewidth of the pattern formed on the reticle R, type of pattern to be transferred, illumination conditions, numerical aperture (NA) of the projection-optical system, and the allowable linewidth error.

At each measurement mark, in order to measure not only the sloping component of the image distortion but also the bending component, at least three points must be measured in the Z direction. The maximum number of points is not limited and a suitable number can be selected depending upon the desired accuracy.

FIG. 5 shows a representative arrangement of measurement marks on a test reticle TR. In FIG. 5, each of the X-axis measurement marks $31X_{1,1}$ to $31X_{5,5}$ comprises a slit-shaped transparent portion extending in the Y-direction. Each of the Y-axis measurement marks $31Y_{1,1}$ to $31Y_{5,5}$ comprises a slit-shaped transparent portion extending in the X-direction. The measurement marks are formed in a (5 row)×(5 column) matrix. A light-shielding portion is formed around the periphery of these measurement marks $31X_{1,1}$ to $31X_{5,5}$, $31Y_{1,1}$ to $31Y_{5,5}$.

A pattern region on which this type of measurement mark is formed has an illumination region IAR with an almost identical size. Illumination light IL is irradiated onto the measurement marks within the illumination region IAR. Then, using a method such as described above with respect to FIG. 2, the position of the projection image of each measurement mark (i.e., position within the XY plane) is measured at a plurality of positions in the Z-direction.

During exposure using an apparatus as shown in FIG. 1, the circuit pattern within the illumination region IAR of the reticle shown in FIG. 5 is transferred to a corresponding exposure region on the wafer W through the projection optical system PL. By measuring distortion of the projection image at each of the measurement marks 31 uniformly distributed in the illumination region IAR, the amount of distortion of the image defined by an actual reticle in the exposure region on the wafer W can be reliably determined.

In FIG. 5, the X-axis measurement marks $31X_{1,1}$, $31X_{1,5}$, $31X_{5,1}$, $31X_{5,5}$ formed at the four corners of the pattern region PA are each situated an equal distance from the optical axis AX. The displacement amount x at an identical height $z_1$ is measured at each measurement mark $31X_{1,1}$, $31X_{1,5}$, $31X_{5,1}$, $31X_{5,5}$, yielding a displacement $x_{1,1}$, $x_{1,5}$, $x_{5,1}$, $x_{5,5}$, respectively, for each mark. In like manner, for the Y-direction as well, the displacement amount at the same image height is measured at the Y-direction measurement marks $31Y_{1,1}$, $31Y_{1,5}$, $31Y_{5,1}$, $31Y_{5,5}$ corresponding to the X-direction measurement marks $31X_{1,1}$, $31X_{1,5}$, $31X_{5,1}$, $31X_{5,5}$, respectively. The same measurements are made at other measurement marks at different image heights. At each measurement mark, displacement amounts x at heights located between heights at which measurements are actually obtained can be determined by a computation involving, e.g., interpolation.

Next, the amount by which to correct image distortion formed by the projection optical system is determined. The amount of correction is determined such that the variation of displacement amount x within the practical depth of focus ΔZ is at a minimum level, as described with respect to FIGS. 3(a)–3(b). For example, at least three measurements are obtained of displacement amount x (each at a different height z) for each measurement mark $31X_{1,1}$–$31X_{5,5}$. An average of the values of x is calculated for each measurement height for all measurement marks. For example, the average value of the displacement amount x at a particular image height is determined from the displacement amounts $((x_{1,1}+x_{1,5}+x_{5,1}+x_{5,5})/4)$ measured at the X-direction measurement marks $31X_{1,1}$, $31X_{1,5}$, $31X_{5,1}$, $31X_{5,5}$, respectively. In like manner, the average value of the displacement amount x at each image height is found at the different focal-point positions (heights) within the practical depth of focus ΔZ.

The average value of the displacement amount x (displacement amount of each measurement mark) at each measurement point found by the above-mentioned method is represented as a function of the image height h and the height z. This function is represented by f(h, z). A correction mechanism performs the required correction amount applicable to minimize the range of values of the function f(h, z).

Although displacement amounts at a certain image height are preferably calculated by determining average values, a value intermediate the maximum and minimum values of each displacement amount at identical image heights could be used as the displacement amount at a certain image height.

By calculating average values or intermediate values of the displacement amount x at various positions in the Z-direction in the foregoing manner, there is the benefit of being able to calculate the correction amount using methods similar to those used for optimizing measurement values at the best-focus position.

Although the correction amount is preferably calculated based on each average value at each image height, the correction amount can be such that the practical depth of focus $\Delta Z$ and the maximum displacement amount set within the range of the maximum image height are both set to minimum levels.

An optimum correction amount can be calculated for all values of x obtained in the Z-direction. This is done by calculating projection-image distortion when the correction mechanism is actuated in the Z direction for each measurement mark and then selecting the location in the Z direction that provides the optimum correction for each measurement mark. Although more calculations are required, this method provides a more optimal correction.

Corrections can also be made by weighting, at each measurement mark, at a location close to both edges of the depth of focus while taking into consideration the level difference during an actual exposure as shown in FIG. 4.

In practice, because an exposure is performed on a photo-resist coating having a certain thickness on a wafer, minimizing projection distortion should take into consideration the properties and thickness of the photo-resist. The methods according to the present invention can readily be performed with such considerations in mind. Distortion measurements can be performed using a photoelectric sensor or a resist image formed by direct exposure.

In any event, after the correction amount is determined, the appropriate correction is made by means of the correction mechanism.

Representative results obtained by performing a distortion-correction method as described above are shown in FIGS. 6(a)–6(f). In order to simplify the description, the rotationally symmetrical component of the projection-image distortion within the exposure region is used for description.

In FIGS. 6(a)–6(f), the abscissa is the average displacement amount $\Delta x$, i.e., the displacement amount (image distortion) in the X-direction at the same image height as the rotation direction is averaged. The ordinate is the image height h (distance on the XY plane from the optical axis AX of the optical projection system PL).

FIGS. 6(a)–6(c) show examples in which the projection-image distortion measured at the best-focus position by a conventional method is adjusted to a minimum. FIG. 6(a) shows the projection-image distortion at a position shifted upward (in the +Z-direction) from the best-focus position by $\Delta F$ only (referred to as the position H on the Z axis), FIG. 6(b) shows distortion at the best focus position, and FIG. 6(c) shows distortion at a position shifted downward (in the −Z-direction) from the best-focus position by $\Delta F$ only (referred to as the position L on the Z axis).

FIGS. 6(d)–6(f) are examples in which adjustments to the projection-image distortion are made using a method according to the invention. These figures also show the projection-image distortion at positions in the Z-direction that correspond to each of FIGS. 6(a)–6(c).

As the curve 37B of FIG. 6(b) indicates, there is almost no variation in the average displacement amount $\Delta x$ that underwent correction by means of the conventional method even if image height h varies at the best-focus position. However, as the plot 37A of FIG. 6(a) and the plot 37C of FIG. 6(c) show, the average displacement amount Ax expands at both the Z positions H, L; thus, in these plots, the projection-image distortion is not distributed optimally at the Z positions H, L.

In contrast, upon performing distortion correction according to the invention, as the plot 38B of FIG. 6(e) shows, the average displacement amount $\Delta x$ shifts in the negative direction relative to the conventional plot 37B (shown by the dotted line as the entire image height, excluding the portion close to the image height 0 at the best-focus position).

As the plot 38A of FIG. 6(d) and the plot 38C of FIG. 6(f) show, at the Z positions H, L, the image height h is especially large with respect to the conventional curves 37A, 37C, respectively (shown by the dotted lines). In other words, the average displacement amount $\Delta x$ at a position separated from the optical axis $\Delta X$ becomes smaller.

Thus, distortion correction is made, according to the invention, such that the maximum value of the average displacement amount $\Delta x$ is set to a minimum level for all image heights at a plurality of positions having different heights (positions in the Z-direction). As a result, if a certain point (certain image height) is focused on, it is not necessary to always correct the distortion at a symmetrical distribution as shown by the curve 35 of FIG. 3(b). However, because the projection-image distortion is distributed, on the whole, an optimum distortion correction is achieved.

Although projection-image distortion caused by the projection optical system is preferably measured using a test reticle TR, the projection-image distortion can also be measured using an actual reticle R. Corrections can be made when adjusting the projection-optical system PL during manufacture of a projection-exposure apparatus incorporating the projection-optical system. Corrections can also be made during periodic maintenance of the projection-exposure apparatus and when anticipating variations in image distortion produced by the projection-optical system PL such as atmospheric variations, variations in the absorption of illumination light by the projection-optical system PL, and variations in illumination. Optimal relationships of distortion correction for such instances can be found by advance testing.

In view of the above, the amount of variation of the projection-image distortion can be determined and corrections automatically made in response to, for example, the output of an atmospheric sensor, a measured value or estimated value of energy (or the history of that incident energy) that is incident to the projection-optical system PL, and the state of the entire apparatus at the time of measurement. If the measurement of projection distortion can be made in a short time without affecting the throughput, the projection-image distortion can be measured by taking an actual exposure and then the distortion corrected based on that result. Further, a combination of the estimation method and actual measurement to reduce the effects on throughput can also be performed.

The present invention is not restricted to batch exposure type projection-exposure apparatus such as steppers. Rather, the invention can be applied in like manner to scanning exposure type projection-exposure apparatus such as stepand-scan apparatus that synchronously scan the reticle and the wafer during exposure of each shot region on the wafer.

Whereas the invention has been described in connection with preferred embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A method for adjusting distortion of a projection-optical system having an optical axis and that projects an image of a pattern formed on a mask onto a substrate, the method comprising the steps:

(a) at an imaging position shifted along the optical axis from a best-focus position of the projection-optical system, detecting distortion of a defocused image projected by the projection-optical system; and (b) adjusting the projection optical system based on the detected distortion so as to change the distortion of the projected image formed by the projection optical system.

2. The method of claim 1, wherein step (b) comprises adjusting the projection optical system such that a distribution of the image distortion within a depth of focus of the projection optical system is set to a minimum.

3. The method of claim 1, wherein step (a) comprises detecting the distortion at a measurement surface selected based on at least one condition selected from a group consisting of a line-width of the pattern formed on the mask, an illumination condition for the mask, a numerical aperture of the projection optical system, and an allowable range of the line-width error of the pattern formed on the substrate.

4. The method of claim 1, wherein the projection optical system comprises a first lens group and a second lens group, and wherein step (b) comprises moving the first lens group relative to the second lens group.

5. The method of claim 1, wherein step (b) comprises performing at least one of adjusting a configuration of optical elements in the projection-optical system and adjusting a position of the mask relative to the projection-optical system.

6. The method of claim 5, wherein step (b) comprises adjusting a lens element of the projection-optical system.

7. The method of claim 6, wherein step (b) comprises adjusting a tilt of the lens element relative to the optical axis.

8. The method of claim 5, wherein step (b) comprises adjusting a tilt of the mask relative to the optical axis.

9. A method for adjusting distortion of a projection optical system having an optical axis and that projects an image of a pattern formed on a mask onto a substrate, the method comprising the steps:

(a) measuring a distortion of the image projected by the projection optical system at a plurality of positions in an optical-axis direction of the projection optical system; and (b) adjusting the projection optical system based on the detected distortion so as to change the distortion of the projected image formed on the substrate by the projection optical system.

10. The method of claim 9, wherein step (b) comprises adjusting the projection optical system such that a distribution of the image distortion within the depth of focus of the projection optical system is set to a minimum.

11. The method of claim 9, wherein step (a) comprises detecting the distortion at a measurement surface selected based on at least one condition selected from a group consisting of a line-width of the pattern formed on the mask, an illumination condition for the mask, a numerical aperture of the projection optical system, and an allowable range of the line-width error of the pattern formed on the substrate.

12. The method of claim 9, wherein step (b) comprises performing at least one of adjusting a configuration of optical elements in the projection-optical system and adjusting a position of the mask relative to the projection-optical system.

13. The method of claim 12, wherein step (b) comprises adjusting a lens element of the projection-optical system.

14. The method of claim 13, wherein step (b) comprises adjusting a tilt of the lens element relative to the optical axis.

15. The method of claim 12, wherein step (b) comprises adjusting a tilt of the mask relative to the optical axis.

16. A projection-exposure method for exposing a substrate with an image of a pattern defined on a mask through a projection optical system, the method comprising the steps:

(a) projecting a predetermined pattern image through the projection optical system;

(b) detecting the predetermined pattern image within the depth of focus of the projection optical system at multiple positions in the optical-axis direction of the projection optical system; and (c) adjusting an image characteristic of the image of the pattern defined by the mask projected onto the substrate through the projection optical system based on the detection result of the projection image.

17. The method of claim 16, wherein, in step (c), a distribution of the distortion of the predetermined pattern within the depth of focus of the projection optical system is set to a minimum.

18. A method for adjusting an optical characteristic of a projection-optical system that projects a pattern defined by a mask onto a substrate, the method comprising:

(a) at a minimum of two selected positions representing a range along an optical axis of the projection-optical system, measuring distortion of an image of the pattern as projected by the projection-optical system; and (b) adjusting the optical characteristic of the projection-optical system based on the measured distortion within the range.

19. The method of claim 18, wherein:

the range represents the depth of focus of the projection-optical system; and the optical characteristic is adjusted such that any change in distortion over the range of depth of focus is minimized.

20. The method of claim 19, further comprising the step of determining an average value of distortion at each of the positions along the optical axis, wherein the optical characteristic is adjusted based on the determined averaged values.

21. The method of claim 19, further comprising the step of determining an intermediate value of distortion relative to values of distortion determined at each of the positions along the optical axis, wherein the optical characteristic is adjusted based on the determined intermediate value.

22. The method of claim 18, further comprising the step of performing step (a) at multiple image locations in an XY plane perpendicular to the optical axis.

23. A method for adjusting an optical characteristic of a projection-optical system that projects a pattern defined by a mask onto a substrate, the method comprising:

(a) providing a measurement mark on a reticle extending in the X and Y directions;

(b) illuminating an image of the measurement mark through a projection-optical system onto a reference mark displaced a distance in a Z direction from the reticle;

(c) from position data of the reference mark in X and Y directions when the image of the measurement mark intersects the reference mark, determining a distortion of the projection-optical system at the reference mark;

(d) at each of multiple positions within a range along the Z direction, repeating steps (b)–(c) to obtain a measurement of distortion of the projection-optical system at the multiple positions in the range; and (e) adjusting the projection-optical system based on the distortion measurement.

24. The method of claim 23, wherein:

step (d) comprises determining an average distortion over the multiple positions in the range; and step (e) comprises adjusting the projection-optical system so as to minimize the average distortion in the range.

25. The method of claim 23, wherein step (d) is performed at least three positions within the range.

26. The method of claim 23, wherein the range represents a depth of focus of the projection-optical system.

27. The method of claim 23, further comprising repeating steps (b)–(d) at each of multiple locations in the X and Y directions.

* * * * *

UNITED STATES PATENT AND TRADEMARK OFFICE
CERTIFICATE OF CORRECTION

PATENT NO. : 5,945,239
DATED : August 31, 1999
INVENTOR(S) : Tetsuo Taniguchi

It is certified that error appears in the above-identified patent and that said Letters Patent is hereby corrected as shown below:

Column 5, line 37, "ed" should be deleted between "path" and "for".

Column 10, line 59, an open parenthesis --(-- should be insert before "i.e.".

Column 14, line 8, "amount Ax" should be --amount $\Delta$x--.

Column 14, line 23, "optical axis $\Delta$X" should be --optical axis AX--.

Signed and Sealed this

Thirtieth Day of May, 2000

Attest:

Q. TODD DICKINSON

*Attesting Officer*    *Director of Patents and Trademarks*